US008306247B2

(12) United States Patent
Lee et al.

(10) Patent No.: US 8,306,247 B2
(45) Date of Patent: Nov. 6, 2012

(54) ELECTRONIC DEVICE AND ELECTRO-ACOUSTIC TRANSDUCER THEREOF

(75) Inventors: Fang-Ching Lee, Taoyuan County (TW); Yi-Tsung Cheng, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 559 days.

(21) Appl. No.: 12/512,787

(22) Filed: Jul. 30, 2009

(65) Prior Publication Data

US 2010/0027818 A1 Feb. 4, 2010

(30) Foreign Application Priority Data

Jul. 31, 2008 (TW) ............................... 97128995 A
May 15, 2009 (TW) ............................... 98116129 A

(51) Int. Cl.
*H03R 25/00* (2006.01)

(52) U.S. Cl. ......................... 381/191; 381/423; 381/427

(58) Field of Classification Search .......... 381/173–176, 381/190–191, 399, 423–427
See application file for complete search history.

(56) References Cited

U.S. PATENT DOCUMENTS

| | | | | |
|---|---|---|---|---|
| 3,711,941 A | | 1/1973 | Sessler et al. | |
| 3,980,838 A | | 9/1976 | Yakushiji et al. | |
| 4,041,446 A | | 8/1977 | Liebermann | |
| 4,160,882 A | | 7/1979 | Driver | |
| 4,246,448 A | * | 1/1981 | Tam et al. | 381/191 |
| 6,075,867 A | * | 6/2000 | Bay et al. | 381/191 |
| 6,496,586 B1 | | 12/2002 | Hayes et al. | |
| 6,931,140 B2 | * | 8/2005 | Van Halteren et al. | 181/173 |
| 2009/0060233 A1 | | 3/2009 | Liou et al. | |

FOREIGN PATENT DOCUMENTS

| | | |
|---|---|---|
| JP | S51-032528 | 8/1974 |
| JP | 50-090320 | 7/1975 |
| JP | S53-006637 | 7/1976 |
| JP | 52-006522 | 1/1977 |
| JP | 54-127317 | 10/1979 |
| JP | S58-120399 | 7/1983 |
| JP | 64-071400 | 3/1989 |
| JP | 2004-186732 A | 7/2004 |
| JP | 2006-174125 A | 6/2006 |
| JP | 2006-254391 A | 9/2006 |
| JP | 2007-104521 A | 4/2007 |
| JP | 2007-295059 A | 11/2007 |
| WO | WO-01/39544 | 5/2001 |
| WO | WO-2004/062318 | 7/2004 |

* cited by examiner

*Primary Examiner* — Suhan Ni

(74) *Attorney, Agent, or Firm* — Birch, Stewart, Kolasch & Birch, LLP

(57) ABSTRACT

The invention provides an electronic device and an electro-acoustic transducer thereof. The electronic device includes a main body and an electro-acoustic transducer carried by the main body. The electro-acoustic transducer includes a first electret diaphragm, a second electret diaphragm and a plate. The first electret diaphragm generates vibrations according to a first electrical signal and the second electret diaphragm generates vibrations according to a second electrical signal. The plate includes a plurality of holes formed thereon and is disposed between the first electret diaphragm and the second electret diaphragm. Additionally, the electronic device further includes a decorative layer formed on the first or the second electret diaphragm.

33 Claims, 15 Drawing Sheets

100

ELECTRONIC DEVICE AND ELECTRO-ACOUSTIC TRANSDUCER THEREOF

This Application claims priorities of Taiwan Patent Application No. 97128995, filed on Jul. 31, 2008, and Taiwan Patent Application No. 98116129, filed on May 15, 2009, the entirety of which are incorporated by reference herein.

BACKGROUND OF THE INVENTION

1. Field of the Invention

The invention relates to an electronic device, and in particular, to an electronic device utilizing an electro-acoustic transducer as a speaker.

2. Description of the Related Art

Nowadays, most electronic devices require transmission of sound messages. Conventional speakers used in electronic devices to transmit sound are usually categorized into dynamic, electrostatic or piezoelectric speakers.

However, the conventional speakers (the dynamic speaker, the electrostatic speaker and the piezoelectric speaker) all require a rigid frame to fasten the speaker diaphragm. Other components disposed within the conventional speaker, such as magnets, coils and metallic plates and so on, are all made from hard materials which are non-flexible and quite heavy. In other words, non-flexibility and heavy weight of the components limit development to further miniaturize electronic devices requiring transmission of sound messages.

BRIEF SUMMARY OF THE INVENTION

The invention provides an electronic device and an electro-acoustic transducer thereof. The electronic device comprises a main body and an electro-acoustic transducer carried by the main body. The electro-acoustic transducer comprises a first electret diaphragm, a second electret diaphragm and a plate. The first electret diaphragm generates vibrations according to a first electrical signal and the second electret diaphragm generates vibrations according to a second electrical signal. The plate comprises a plurality of holes formed thereon and is disposed between the first electret diaphragm and the second electret diaphragm.

The invention provides another electronic device. The electronic device comprises an electro-acoustic transducer. The electro-acoustic transducer comprises an electret diaphragm, a plate, at least one spacer and a decorative layer. The electret diaphragm generates vibrations according to an electrical signal. The plate comprises a plurality of holes formed thereon. The spacer is disposed between the electret diaphragm and the plate. The decorative layer is formed on the electret diaphragm.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1A:
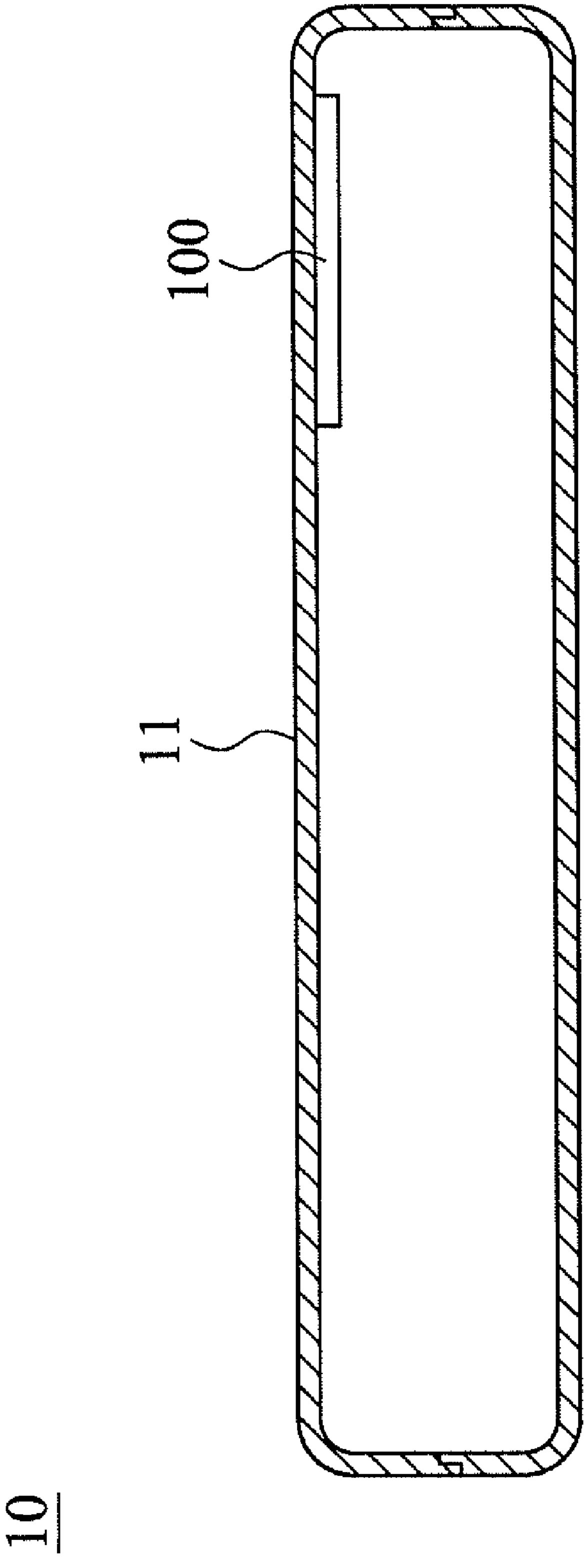
FIG. 1A is a schematic view of an electronic device of the invention.

Referring to FIG. 1A, the electronic device 10 of an embodiment can be a mobile communication device, a game machine, a display device or other multimedia device. The electronic device 10 comprises a housing 11 and an electro-acoustic transducer 100 carried by or disposed inside the housing 11. By inputting positive signals and negative signals to the electro-acoustic transducer 100, the electro-acoustic transducer 100 is activated to vibrate, and further the particles in the air nearby are pushed to generate sound.

Figure 1B:
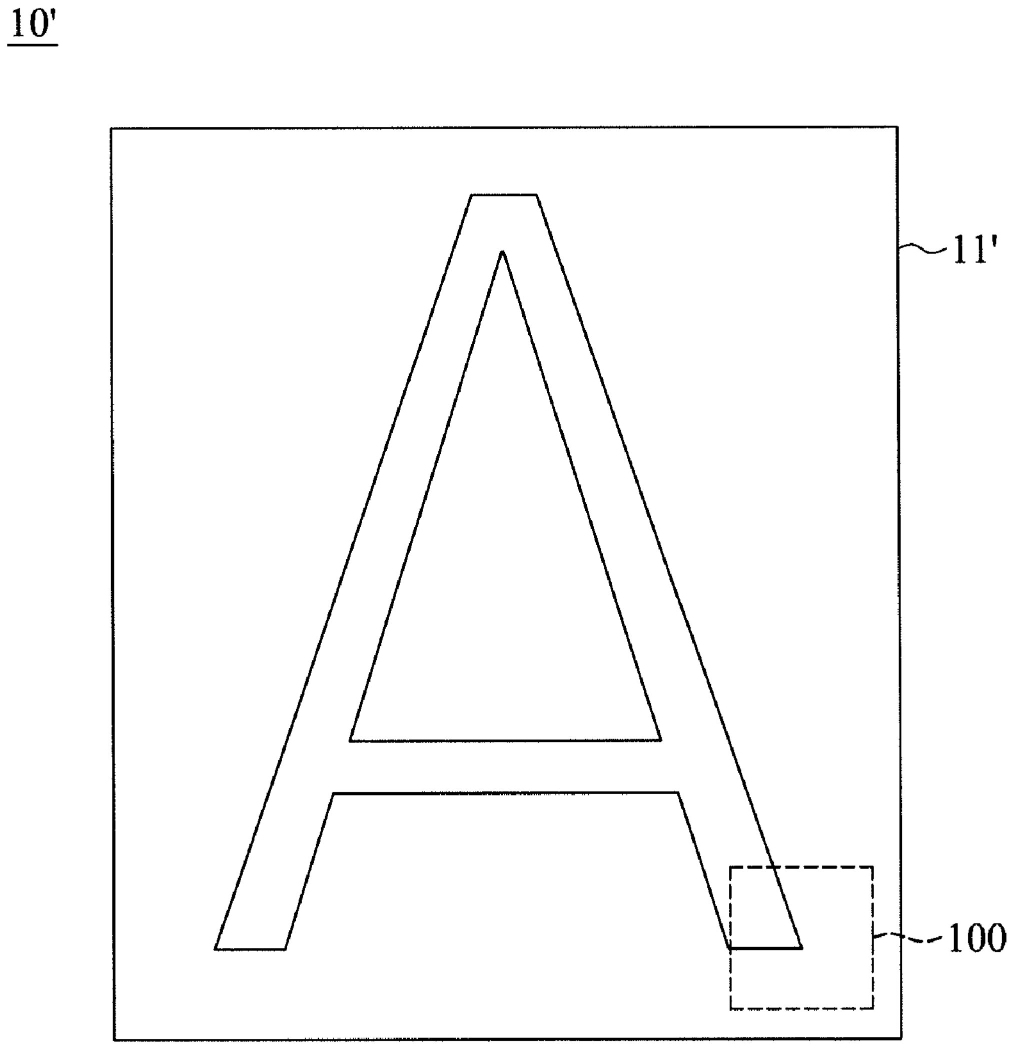
FIG. 1B is a schematic view of the electronic device of the invention.

In addition, the electronic device 10 can also be a sound poster 10' (as shown in FIG. 1B). The electro-acoustic transducer 100 is disposed on a thin flexible material 11', and the thin flexible material 11' can be decorated with images to become a poster. When transmitting visual messages, the sound poster 10' can also transmit the sound messages.

Figure 2A:
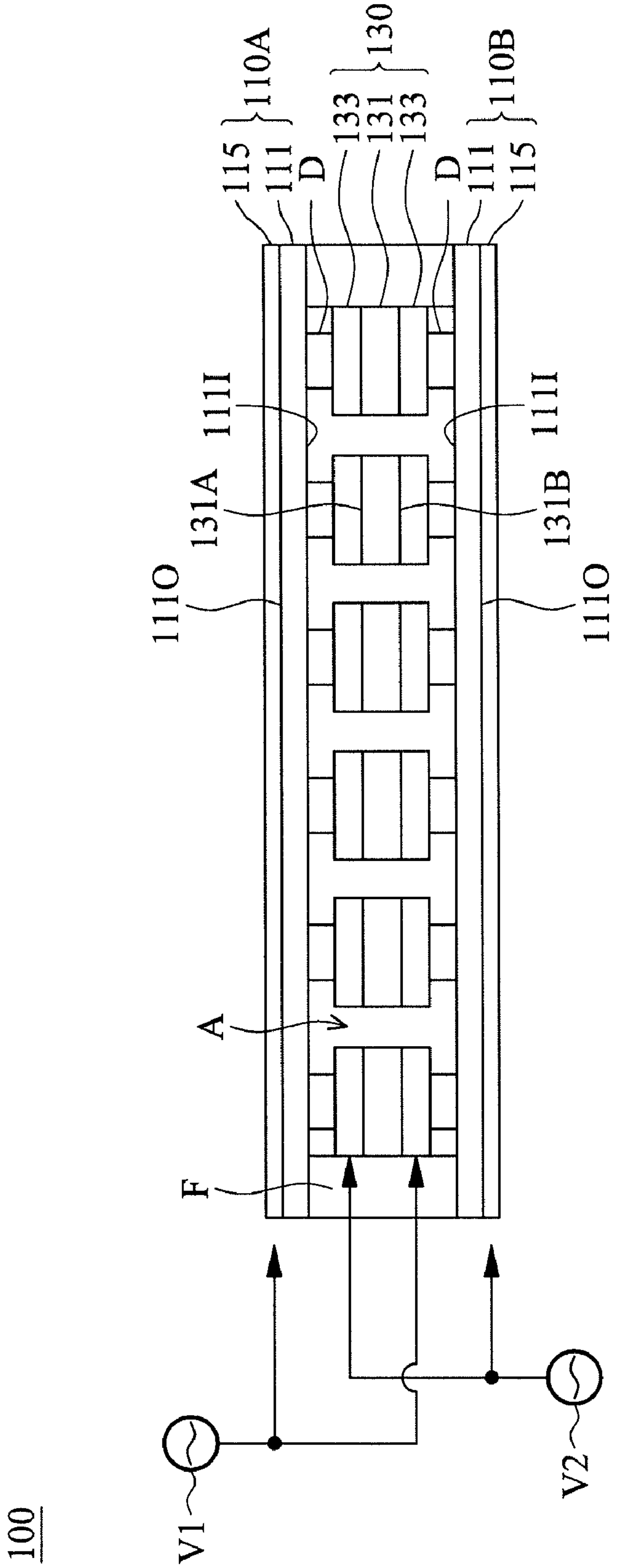
FIG. 2A is a schematic view showing a first embodiment of an electro-acoustic transducer of the invention.

Referring to FIG. 2A, in a first embodiment of the invention, the electro-acoustic transducer 100 comprises an outer frame F, two electret diaphragms 110A, 110B, a plate 130 and a plurality of spacers D.

Each of the two electret diaphragms 110A, 110B comprises a film body 111 and an electrode layer 115. The film body 111 is made of material carrying electric charges or material charged with electric charges and has an inner surface 111I and an outer surface 1110. The electrode layer 115 comprises aluminum, chromium or other electrically conductive material and is formed on the outer surface 1110 of the film body 111.

In the embodiment, the film body 111 is made of tetrafluoroethylene (PTFE) and tetrafluoroethylene-co-hexafluoropropylene (FEP), and can be charged with electric charges so as to carry positive electric charges or negative electric charges. The electrode layer 115 is formed on the film body 111 by a hot embossing, evaporation deposition, sputtering, or spin coating process, but it is not limited thereto.

The plate 130 comprises an insulative layer 131, two electrode layers 133 and a plurality of holes A formed thereon and penetrating the insulative layer 131 and the two electrode layers 133. The insulative layer 131 is made of insulative material and has a first surface 131A and a second surface 131B. The first surface 131A is opposite to the second surface 131B. The two electrode layers 133 are respectively formed by coating electrically conductive material (eg. aluminum or chromium) on the first surface 131A and the second surface 131B of the insulative layer 131 and respectively face the film body 111 of the electret diaphragm 110A and the film body 111 of the electret diaphragm 110B.

The fringes of the two electret diaphragms 110A, 110B are connected to an outer frame F. With support by the outer frame F, the electret diaphragms 110A, 110B can be fully expanded. The plate 130 is disposed inside the outer frame F and between the two electret diaphragms 110A, 110B. In detail, the plate 130 is between the inner surface of the film body 111 of the electret diaphragm 110A and the inner surface of the film body 111 of the electret diaphragm 110. The spacers D are respectively disposed between the plate 130 and the two electret diaphragms 110A, 110B, and a distance is kept therebetween to separate the plate 130 and the two electret diaphragms 110A, 110B, thus maintaining a space for vibrations of the electret diaphragms 110A, 110B.

As shown in FIG. 2A, after assembly, the electrode layer 115 of the electret diaphragm 110A and the electrode layer 133 on the first surface 131 of the insulative layer 131 respectively receive a first electrical signal V1 and a second electrical signal V2. The first electrical signal V1 and the second electrical signal V2 are two analog sound signals having phases opposite to each other, so as to generate an electric field between the electrode layer 115 of the electret diaphragm 110A and the electrode layer 133 on the first surface 131A of the insulative layer 131 to vibrate the electret diaphragm 110A and produce sound. Moreover, the electrode layer 133 on the second surface 131B of the insulative layer 131 and the electrode layer 115 of the electret diaphragm 110B respectively receive the first electrical signal V1 and the second electrical signal V2, so as to generate an electric field therebetween to vibrate the electret diaphragm 110B and produce sound. In other words, while the electrode layer 115 of the electret diaphragm 110A and the electrode layer 133 on the second surface 131B of the insulative layer 131 receive a positive electrical signal, the electrode layer 133 on the first surface 131A of the insulative layer 131 and the electrode layer 115 of the electret diaphragm 110B receive a negative electrical signal, and vice versa.

Figure 2B:
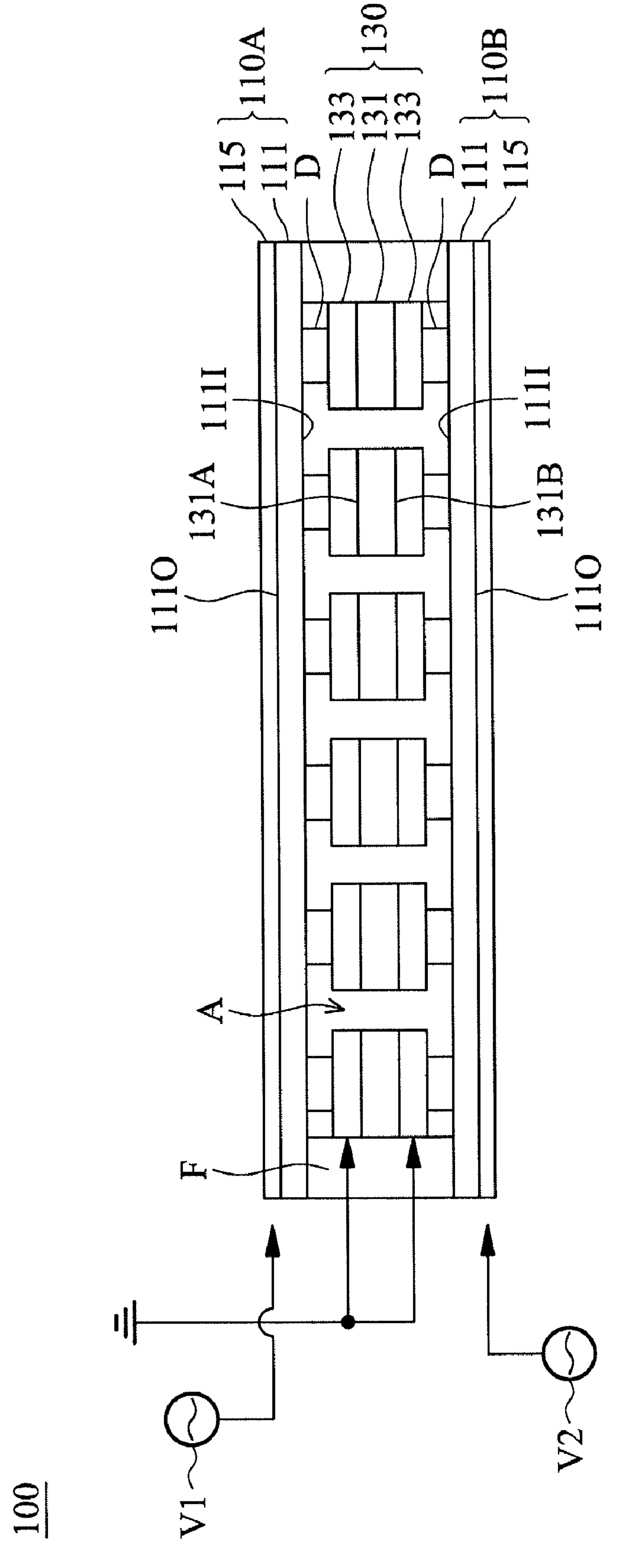
FIG. 2B is a schematic view showing a variant embodiment of the electro-acoustic transducer in the first embodiment.
Figure 2C:
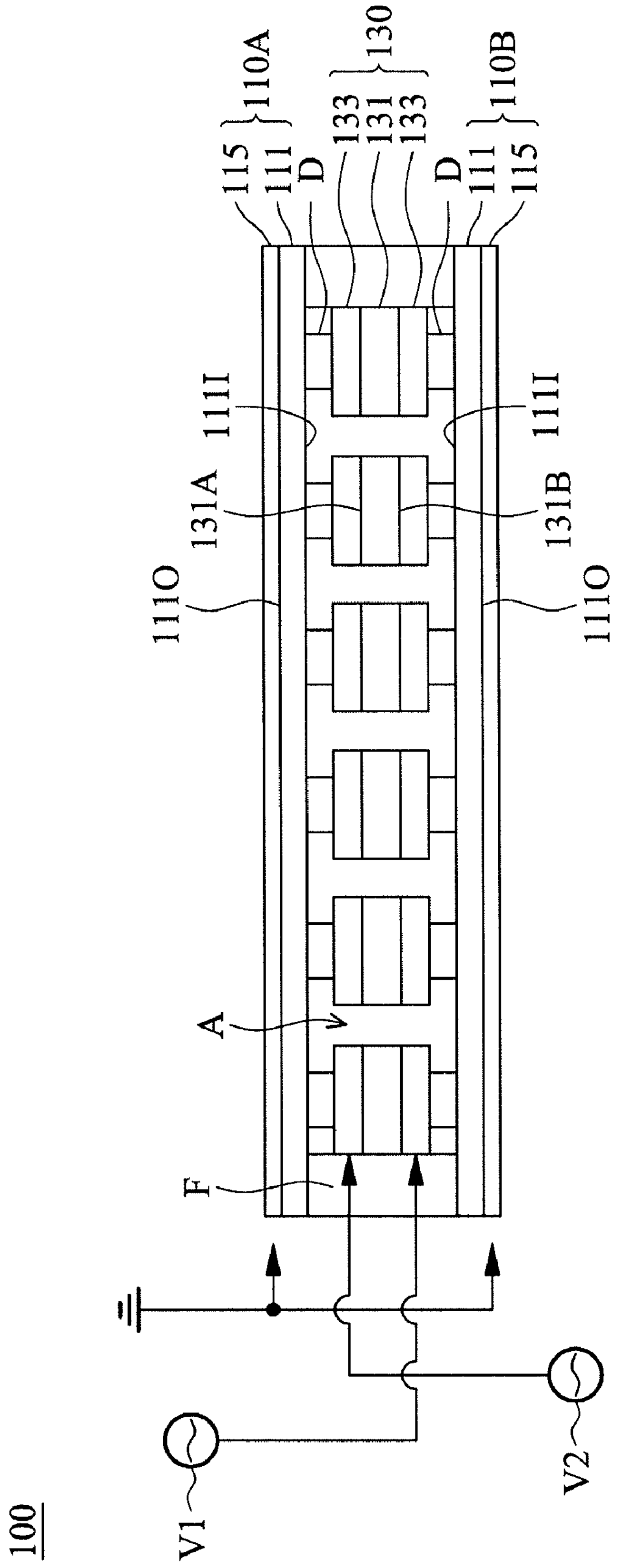
FIG. 2C is a schematic view showing a variant embodiment of the electro-acoustic transducer in the first embodiment.

In a variant embodiment, the electrode layers 133 on the first surface 131A and the second surface 131B of the insulative layer 131 can also connect to the ground (as shown in FIG. 2B). Otherwise, the electrode layers 115 of the electret diaphragms 110A, 110B connect to the ground while the electrodes 133 on the first surface 131A and the second surface 131B of the insulative layer 131 respectively receive the second electrical signal V2 and the first electrical signal V1 (as shown in FIG. 2C). Any of the above connections can achieve the vibration of the electret diaphragms 110A, 110B and produce sound.

Figure 3A:
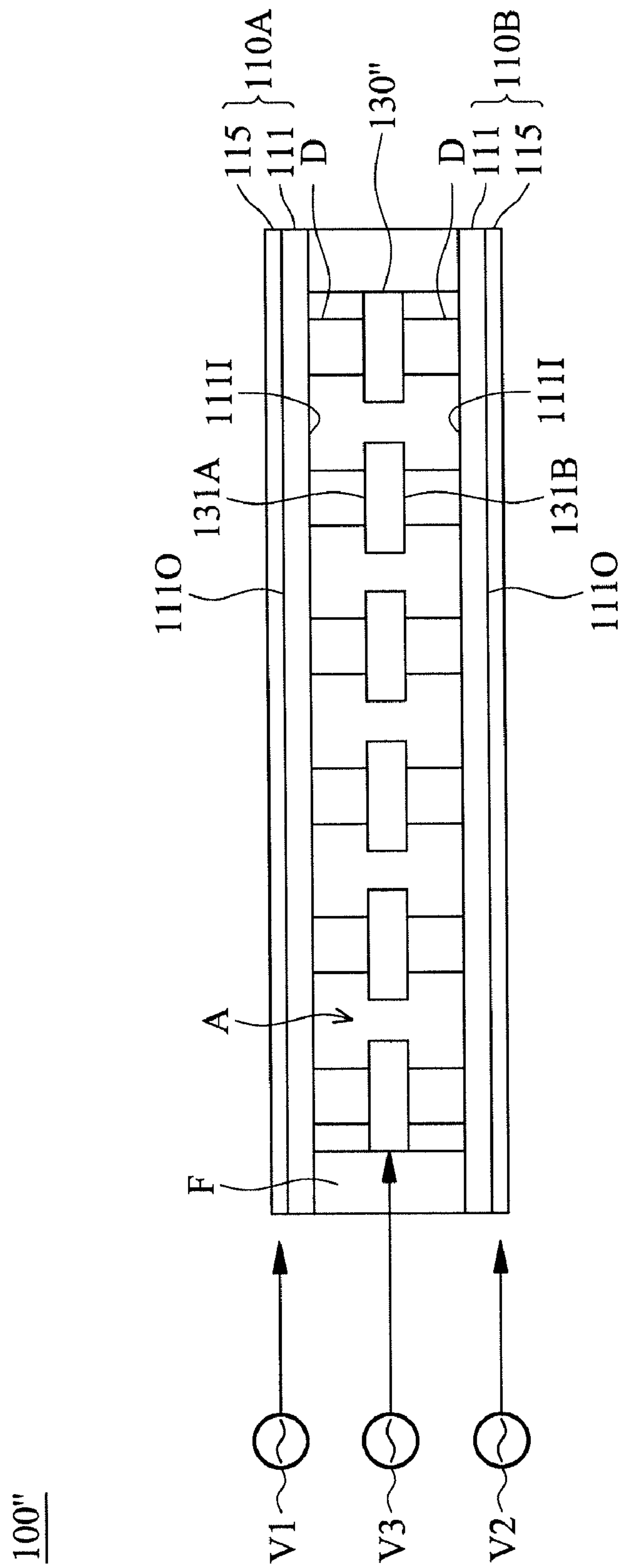
FIG. 3A is a schematic view showing a second embodiment of an electro-acoustic transducer of the invention.

Referring to FIG. 3A, in a second embodiment, the plate 130" of the electro-acoustic transducer 100" is formed integrally as a single piece by conductive material (for example, aluminum or chromium) to function as a single electrode layer so that separate formation of the insulative layer and the electrode layers on both sides of the insulative layer are no longer required. Other components are the same as those disposed in the electro-acoustic transducer 100 in the first embodiment. The design requires a more simplified manufacturing process, and the products thereof are relatively thinner.

The fringes of the two electret diaphragms 110A, 110B connect to the outer frame F. With support by the outer frame F, the electret diaphragms 110A, 110B can be fully expanded. The plate 130 is disposed inside the outer frame F, between the two electret diaphragms 110A, 110B. In detail, the plate 130" is between the inner surface of the film body 111 of the electret diaphragm 10A and the inner surface of the film body 111 of the electret diaphragm 110B. The spacers D are respectively disposed between the plate 130" and the two electret diaphragms 110A, 110B, and a distance is kept therebetween to separate the plate 130" and the two electret diaphragms 110A, 110B, thus maintaining a space for vibrations for the electret diaphragms 110A, 110B. In this embodiment, the spacers D and the plate 130 may be integrally formed as a single piece by any electrical conductive material (eg. gold, silver, copper, aluminum, chromium or Indium Tin Oxide), or the spacers D may be attached to the plate 130 by any adhesive means.

Referring to FIG. 3A, the film body 111 of the electret diaphragm 110A has positive electric charges carried thereon, and the film body 111 of the electret diaphragm 110B has negative electric charges carried thereon. The electrode layer 115 of the electret diaphragm 110A receives a first electrical signal V1, the electrode 115 of the electret diaphragm 110B receives a second electrical signal V2, and the plate 130" receives a third electrical signal V3.

The first electrical signal V1 and the second electrical signal V2 are sound signals (analog signals) having identical phases, and the third electrical signal V3 is a signal having a phase opposite to the phase of the first electrical signal V1 and the second electrical signal V2. In other words, when the first electrical signal V1 and the second electrical signal V2 are positive (e.g. +100V), the third electrical signal V3 is negative (eg. −100V), and when the first electrical signal V1 and the second electrical signal V2 are negative (e.g. −100V), the third electrical signal V3 is positive (e.g. +100V), such that the electrode layers 115 of the electret diaphragms 110A, 110B and the plate 130" can generate potential differences. Thereby, the first electret diaphragm 110A vibrates according to the potential difference between the first electrical signal V1 and the third electrical signal V3 while the second electret diaphragm 110B vibrates according to the potential difference between the second electrical signal V2 and the third electrical signal V3.

Figure 3B:
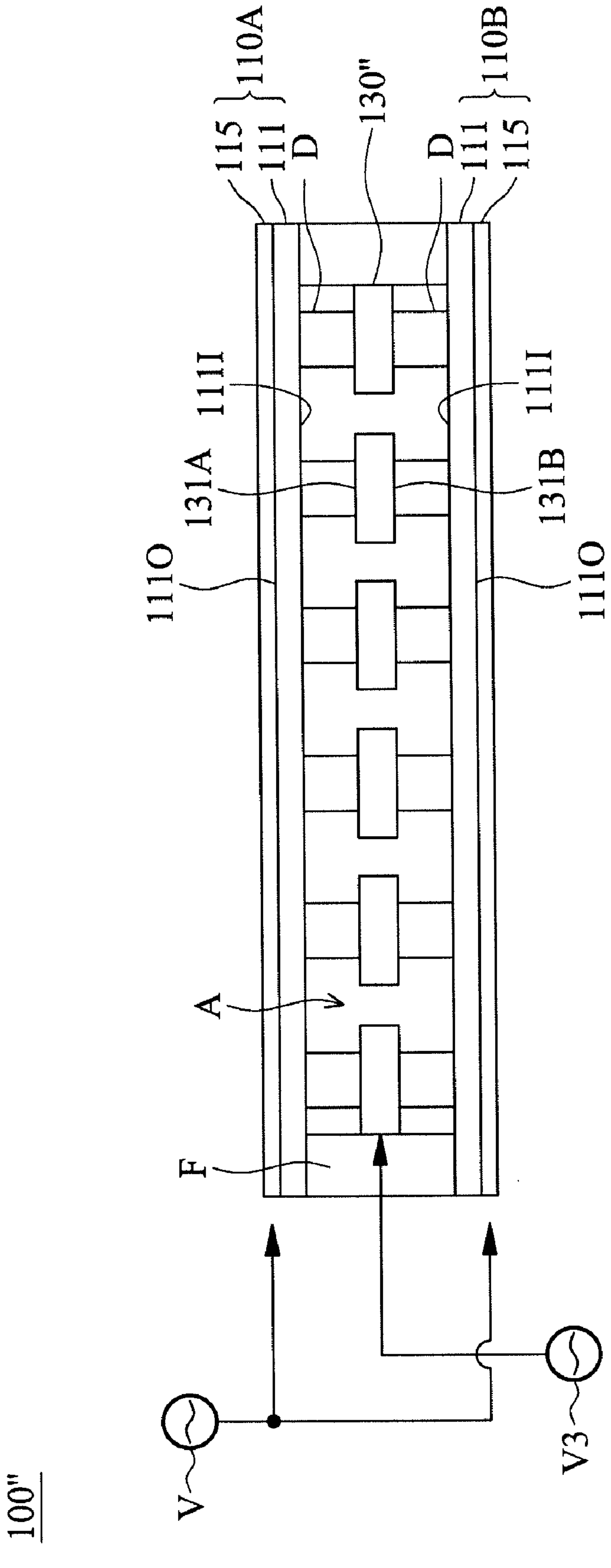
FIGS. 3B-3E are schematic views showing variant embodiments of the electro-acoustic transducer in the second embodiment.

It should be noted that, as shown in FIG. 3A, the first electrical signal V1 and the second electrical signal V2 can have identical phases but different amplitudes, and the third electrical signal V3 has a phase opposite to that of the first electrical signal V1 or the second electrical signal V2. Otherwise, as shown in FIG. 3B, the first electrical signal V1 and the second electrical signal V2 are the same, that is, to receive the same signal V, and the plate 130" may receive a signal V3 which has a phase opposite to that of the signal V.

The electret diaphragm is forced as $F=C\times E\times\Delta V$, wherein C is the capacity between the electret diaphragm and the plate 130", E is the intensity of the electric field between the electret diaphragm and the plate 130", which is formed by a static charge distribution on the surface of the electret diaphragm, and $\Delta V$ is the potential difference between the electret diaphragm and the plate 130". The multiplication of the above three factors results in a vibration force F to vibrate the electret diaphragm to generate sounds.

Additionally, because the film body 111 of the electret diaphragm 110A has positive electric charges carried thereon, and the film body 111 of the electret diaphragm 110B has negative electric charges carried thereon, when the potential difference between the first electrical signal V1 and the second electrical signal V2 is positive, the film body 111 of the electret diaphragm 110A is repulsed away from the plate 130". Therefore, the electret diaphragm 110A vibrates upwards. Meanwhile, the film body 111 of the electret diaphragm 110B is attracted to the plate 130". Therefore, the electret diaphragm 110B vibrates upwards as well. Contrarily, when the potential difference between the first electrical signal V1 and the second electrical signal V2 is negative, the film body 111 of the electret diaphragm 110A is attracted to the plate 130". Therefore, the electret diaphragm 110A vibrates downwards. Meanwhile, the film body 111 of the electret diaphragm 110B is repulsed away from the plate 130". Therefore, the electret diaphragm 110B vibrates downwards as well. As described, the vibrating directions of the electret diaphragms 110A and 110B are the same no matter what the potential difference between the first electrical signal V1 and the second electrical signal V2 is.

Figure 3C:
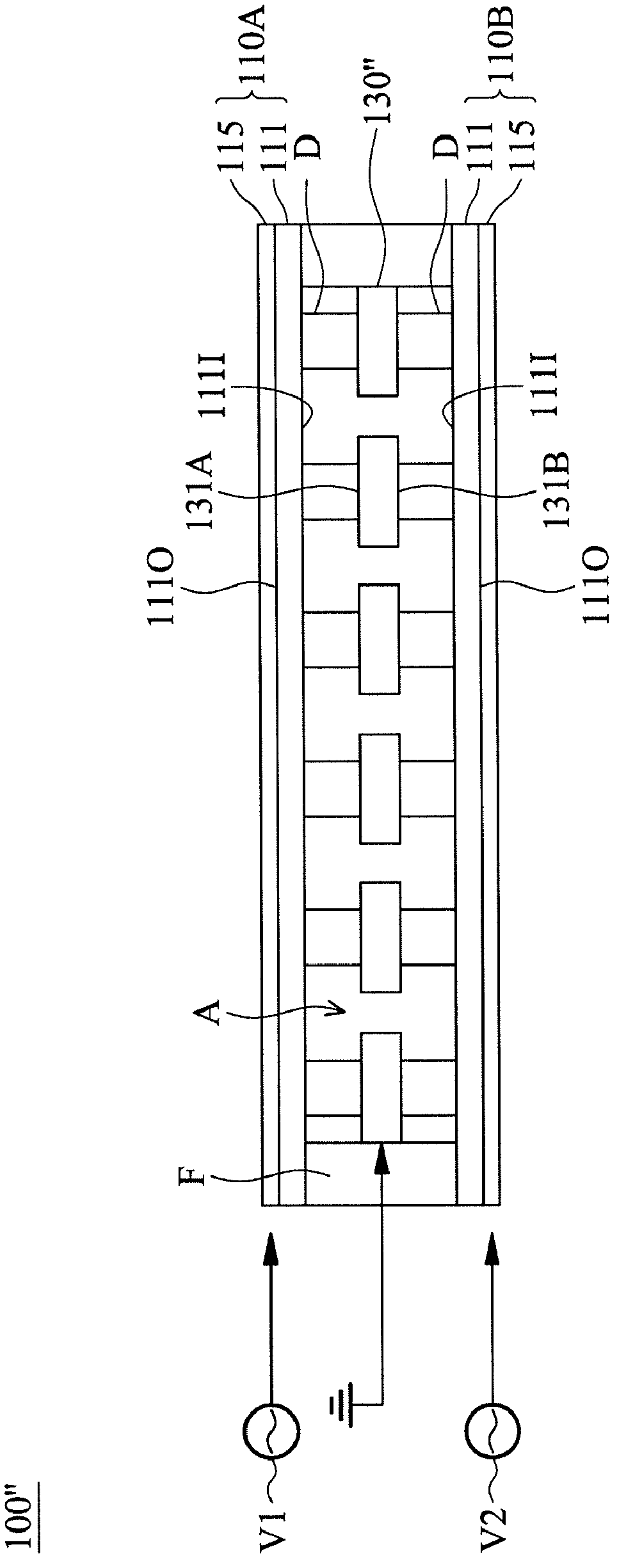
Figure 3D:
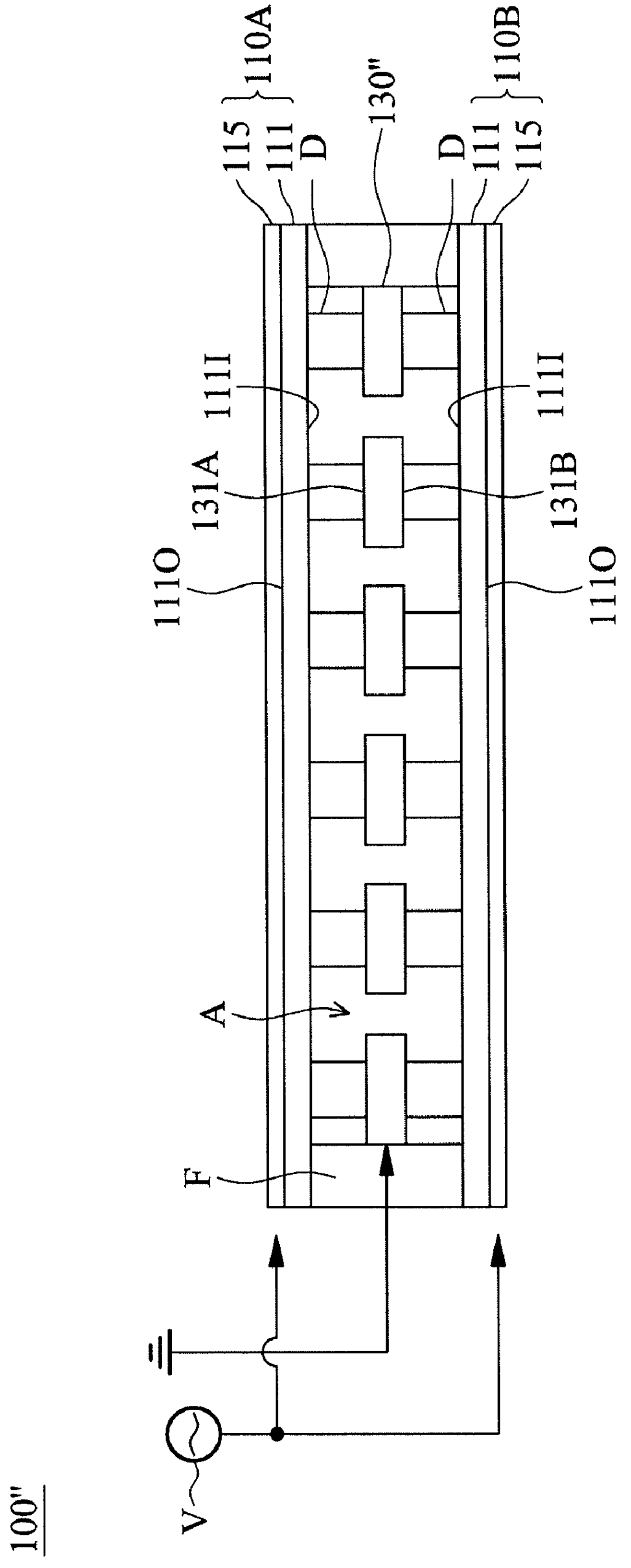
Figure 3E:
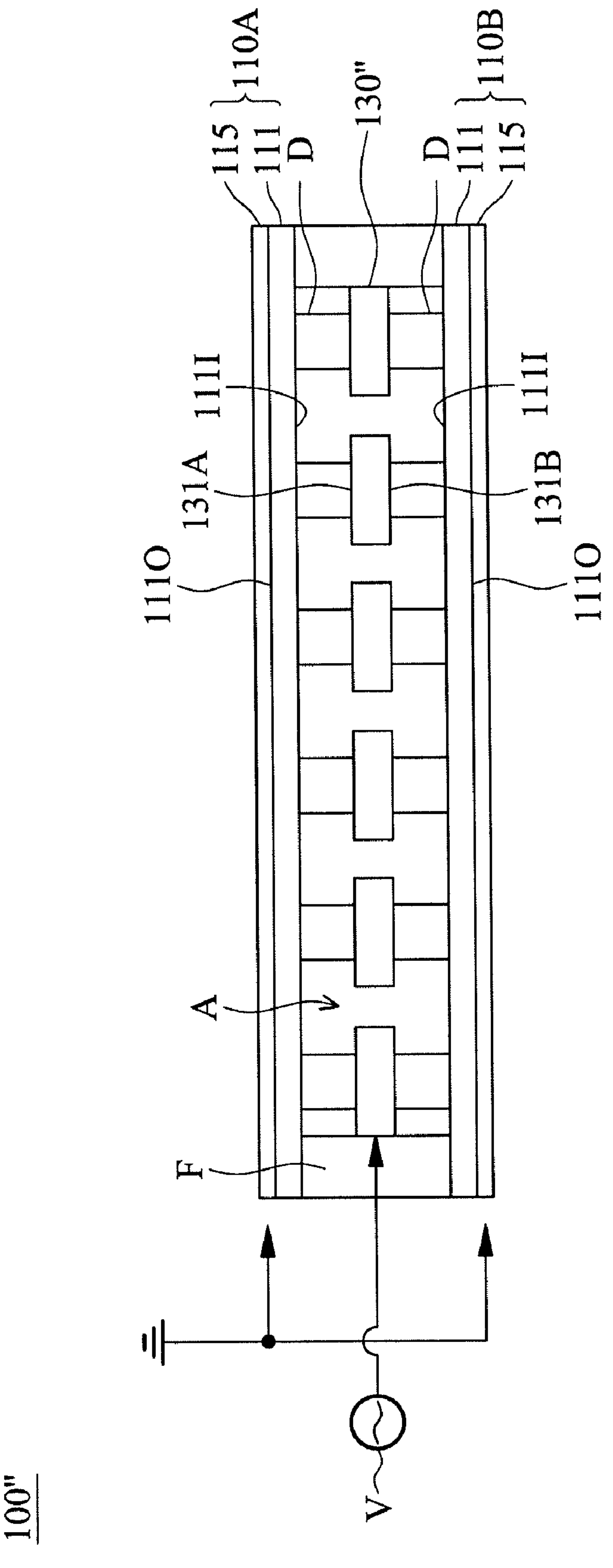

Referring to FIGS. 3C to 3E, in other variant embodiments, the plate 130" is connected to the ground, and the electrode layers 115 of the electret diaphragms 110A, 110B respectively receive the first electrical signal V1 and the second electrical signal V2 having identical phases (as shown in FIG. 3C). Alternatively, the plate 130" is connected to the ground, and the electrodes layers 115 of the electret diaphragms 110A, 110B receive an electrical signal V (as shown in FIG. 3D). Contrarily, the plate 130" receives an electrical signal V, and the electrode layers 115 of the electret diaphragms 110A, 110B are connected to the ground (as shown in FIG. 3E). In the above embodiments, the potential differences between the electret diaphragms 110A, 110B and the plate 130" are successfully generated, achieving vibration of the electret diaphragms 110A, 110B, and thus generating sounds.

Figure 4A:
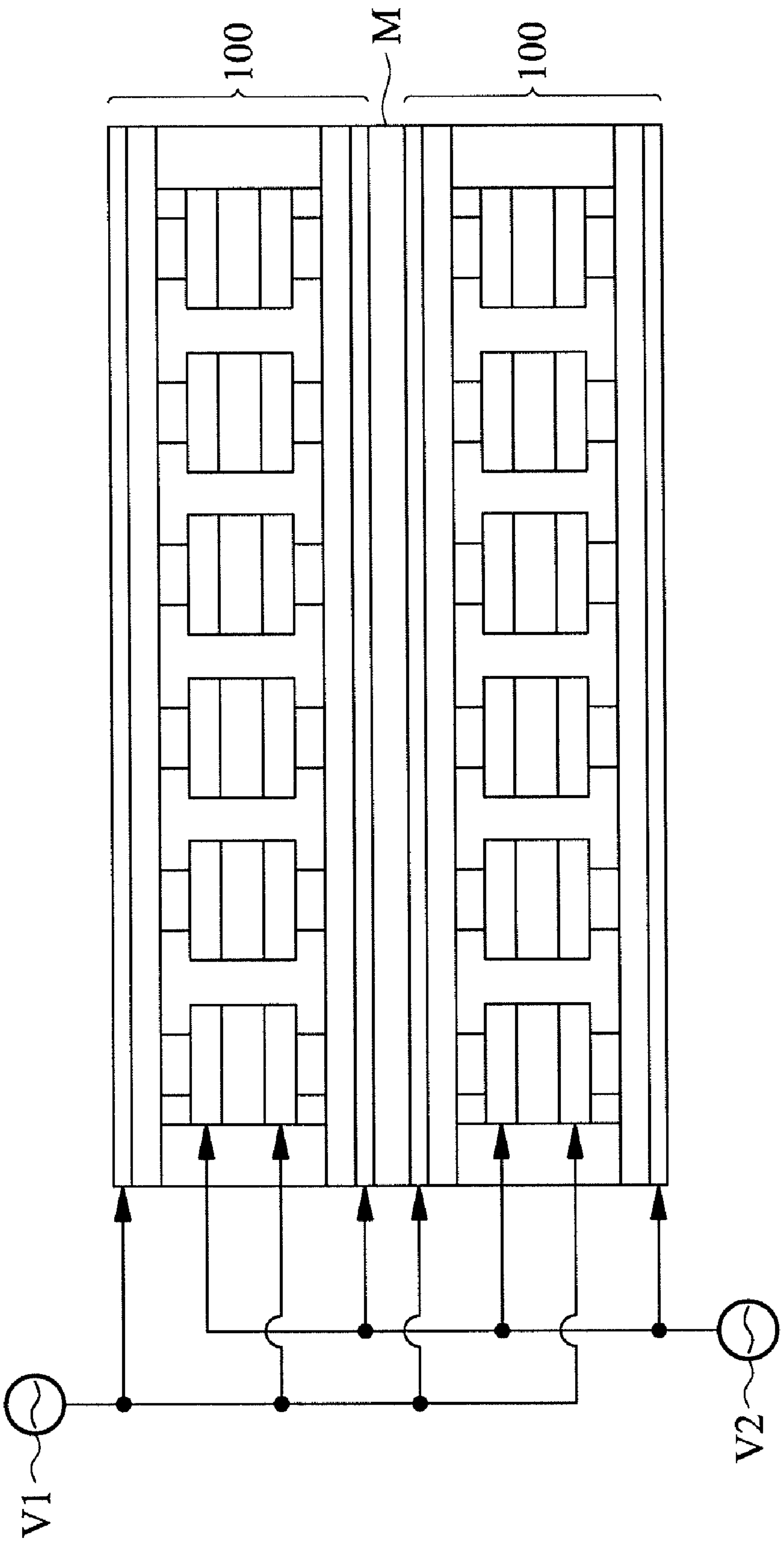
FIG. 4A is a schematic view showing a combination of multiple electro-acoustic transducers in the first embodiment.
Figure 4B:
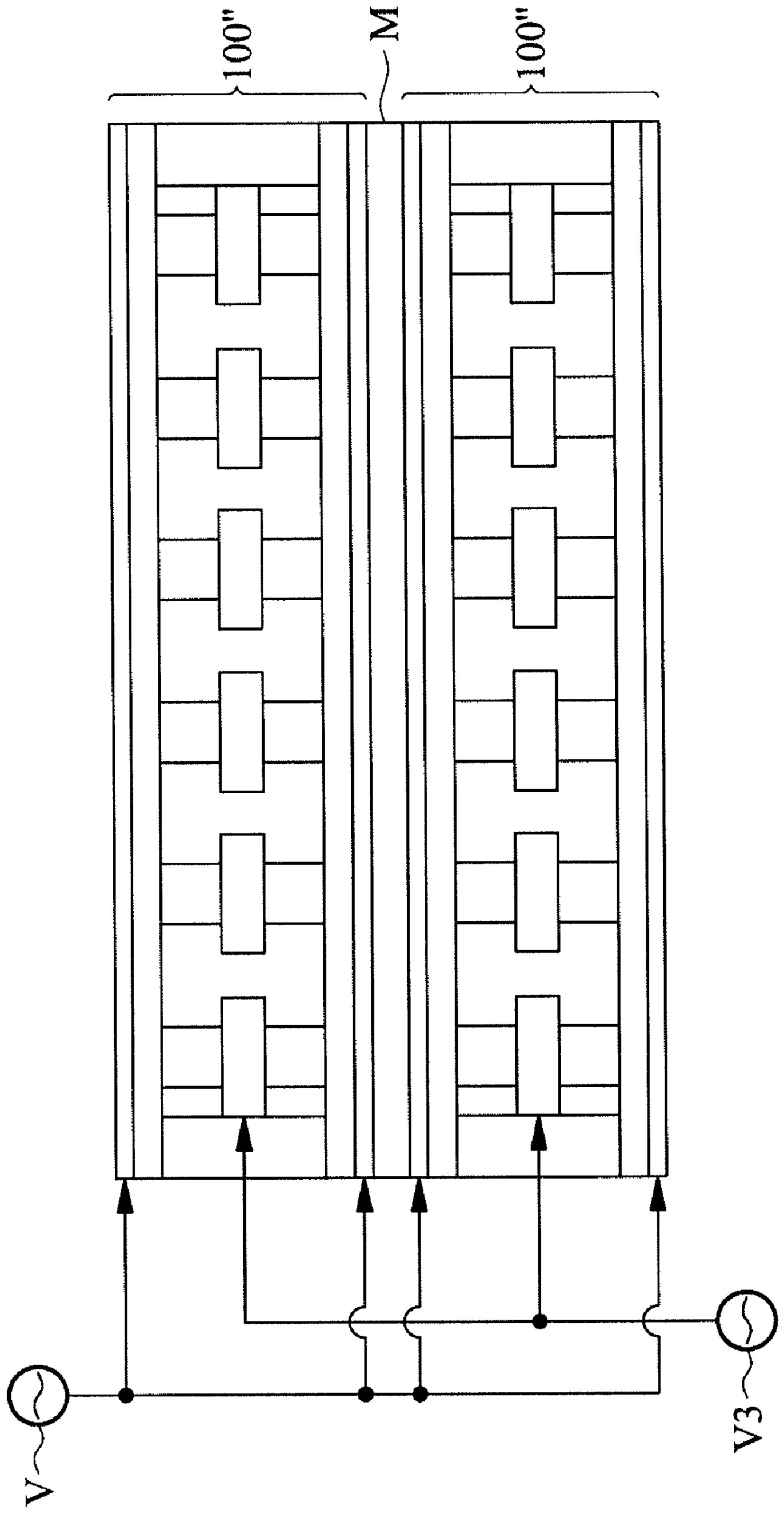
FIG. 4B is a schematic view showing another combination of multiple electro-acoustic transducers in the second embodiment.

Furthermore, if required, the electronic device 10 can comprises more than one electro-acoustic transducer, such as two electro-acoustic transducers 100, 100", stacked together as shown in FIGS. 4A and 4B. The two electro-acoustic transducers 100, 100" are layered onto each other. In this embodiment, only an insulative film M is required to be disposed therebetween.

Figure 4C:
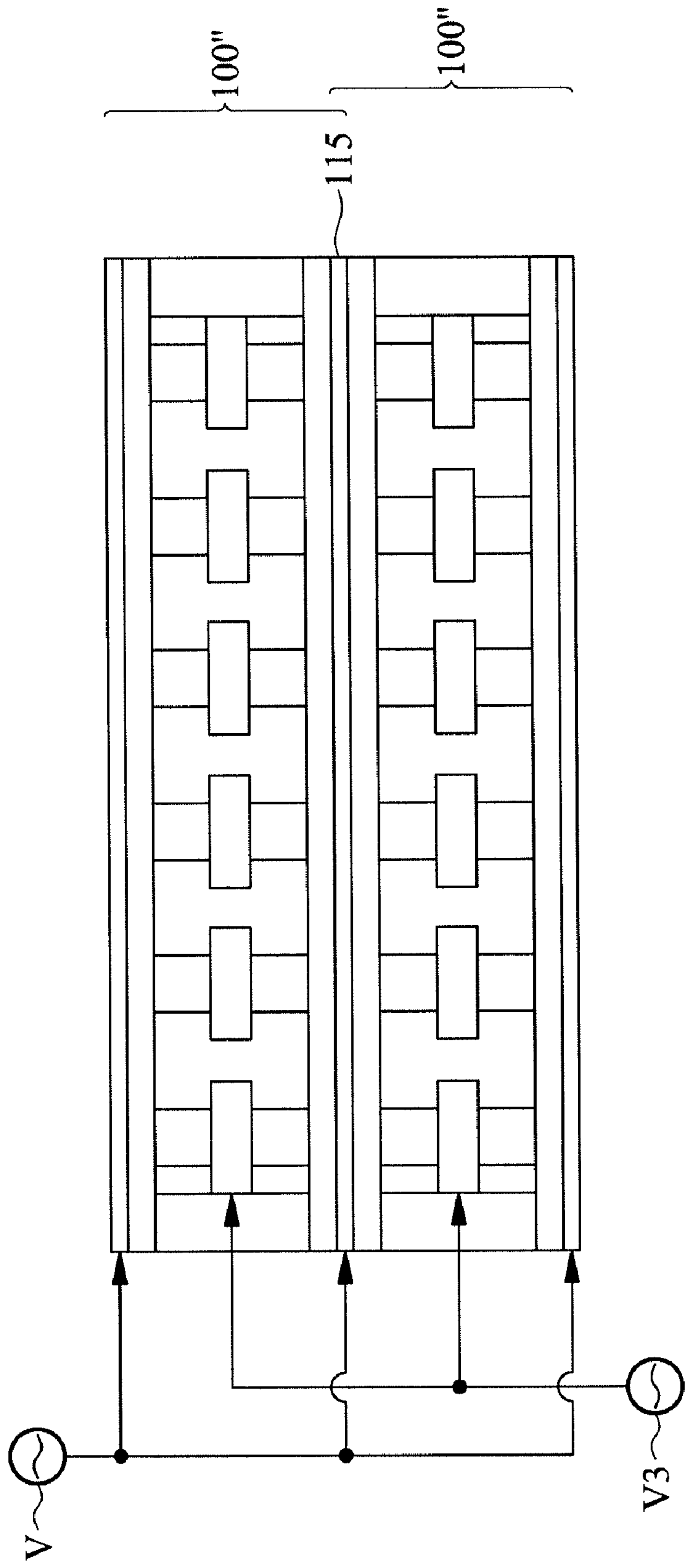
FIG. 4C is a schematic view showing a combination of multiple electro-acoustic transducers in the second embodiment.

As shown in FIG. 4C, when multiple electro-acoustic transducers 100" in the second embodiment are layered onto each other, insulative films M can be omitted. Moreover, a common electrode layer 115 is utilized to connect two adjacent electro-acoustic transducers 100", such that the manufacturing process can be simplified, and the overall thickness of layered electro-acoustic transducers 100" can be further reduced.

Figure 5:
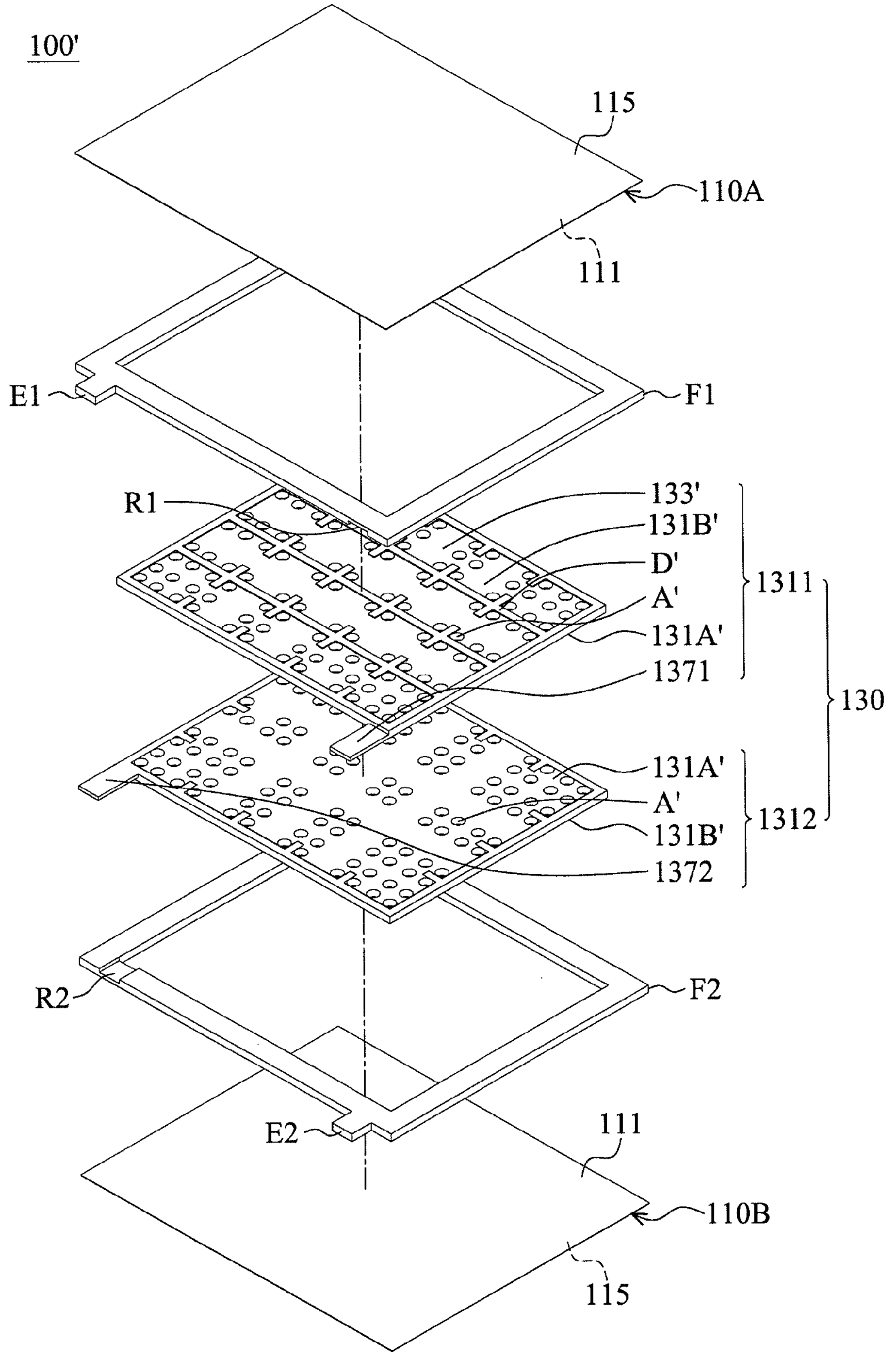
FIG. 5 is a schematic view of a third embodiment of the electro-acoustic transducers of the invention.

Referring to FIG. 5, in a third embodiment, the electro-acoustic transducer 100' comprises a first outer frame F1 and a second outer frame F2. The plate 130 comprises a first insulative sub-layer 1311, a second insulative sub-layer 1312, two electrode layers 133' and a plurality of holes A' formed thereon. The hole A' penetrates the first insulative sub-layer 1311, the second insulative sub-layer 1312 and the two electrode layers 133'. The first insulative sub-layer 1311 and the second insulative sub-layer 1312, layered onto each other, respectively have an inner surface 131A', an outer surface 131B' and a plurality of spacers D'. The inner surface 131A' is opposite to the outer surface 131B'. The spacers D' protrude from and are integrally formed with the outer surfaces 131B' of the first insulative sub-layer 1311 and the second insulative sub-layer 1312 (the spacers D' on the outer surface 131B' of the second insulative sub-layer 1312 are not shown) to contact the electret diaphragms 110A, 110B. In addition, the two electrode layers 133' are respectively formed by coating electrically conductive material on the outer surfaces 131B' of the first insulative sub-layer 1311 and the second insulative sub-layer 1312. In the embodiment, the shape of the spacers D' is not limited as shown in the drawings. The spacers D' can be a circular, rectangular, triangular or an X shape protruding from the outer surfaces 131B' of the first insulative sub-layer 1311 and the second insulative sub-layer 1312.

The fringes of the two electret diaphragms 110A, 110B are respectively mounted on the first outer frame F1 and the second outer frame F2. With support by the first outer frame F1 and the second outer frame F2, the electret diaphragms 100A, 110B can be fully expanded. The first insulative sub-layer 1131 and the second insulative sub-layer 1132, made from insulative material, are respectively disposed within the first outer frame F1 and the second outer frame F2. The inner surfaces 131A' of the first insulative sub-layer 1311 and the second insulative sub-layer 1312 face each other, and the outer surfaces 131B' thereof respectively face the two electret diaphragms 110A, 110B, such that the spacers D' formed on the outer surfaces 131B' are distributed between the first insulative sub-layer 1311 and the electret diaphragm 110A, and between the second insulative sub-layer 1312 and the electret diaphragm 110B. As a result, the plate 130 and the two electret diaphragms 110A, 110B are separated to maintain a space for vibrations of the electret diaphragms 110A, 110B. At last, the first outer frame F1 and the second outer frame F2 are connected to complete assembly.

It should be noted that in the embodiment, the plate 130 further comprises a adhesive layer (not shown) between the inner surfaces 131A' of the first insulative sub-layer 1311 and the second insulative sub-layer 1312 to connect the first insulative sub-layer 1311 and the second insulative sub-layer 1312.

Furthermore, as shown in FIG. 5, the first outer frame comprises a first recess R1 and a first protrusion E1, and the second outer frame F2 comprises a second recess R2 and a second protrusion E2. The first insulative sub-layer 1311 and the second insulative sub-layer 1312 respectively comprise a first extending portion 1371 and a second extending portion 1372.

When the first insulative sub-layer 1311 is disposed within the first outer frame F1, the first extending portion 1371 of the first insulative sub-layer 1311 extends out of the first outer frame F1 via the first recess R1. When the second insulative sub-layer 1312 is disposed within the second outer frame F2, the second extending portion 1372 of the second insulative sub-layer 1312 extends out of the second outer frame F2 via the second recess R2. When the first outer frame F1 connects with the second outer frame F2, the first protrusion E1 of the first outer frame F1 connects with the second extending portion 1372 of the second insulative sub-layer 1312 to form a first electrical input terminal electrically connected to the electrode layer 115 of the electret diaphragm 110A and the electrode layer 133' of the second insulative sub-layer 1312. The second protrusion E2 of the second frame F2 connects with the first extending portion 1371 of the first insulative sub-layer 1311 to form a second electrical input terminal electrically connected to the electrode layer 115 of the electret diaphragm 110B and the electrode layer 133' of the first insulative sub-layer 1311.

The first electrical input terminal is input with a first electrical signal and transmits the first electrical signal to the electrode layer 115 of the electret diaphragm 110A and the electrode layer 133' of the second insulative sub-layer 1312, and the second electrical input terminal is input with a second electrical signal opposite to the first electrical signal and transmits the second electrical signal to the electrode layer 115 of the electret diaphragm 110B and the electrode layer 133' of the first insulative sub-layer 1311, so as to generate an electric field between the electrode of the electret diaphragms 110A, 110B and the electrode on the first and the second insulative sub-layers 1311, 1312 whereby making the electret diaphragms 110A, 110B to vibrate to produce the sound.

In other embodiments of the invention, the plate 130 as shown in FIG. 5 can also be integrally formed by any electrical conductive material (eg. gold, silver, copper, aluminum, chromium or Indium Tin Oxide) to function as an electrode layer structured in the electro-acoustic transducer in FIGS. 3A to 3E.

Figure 6:
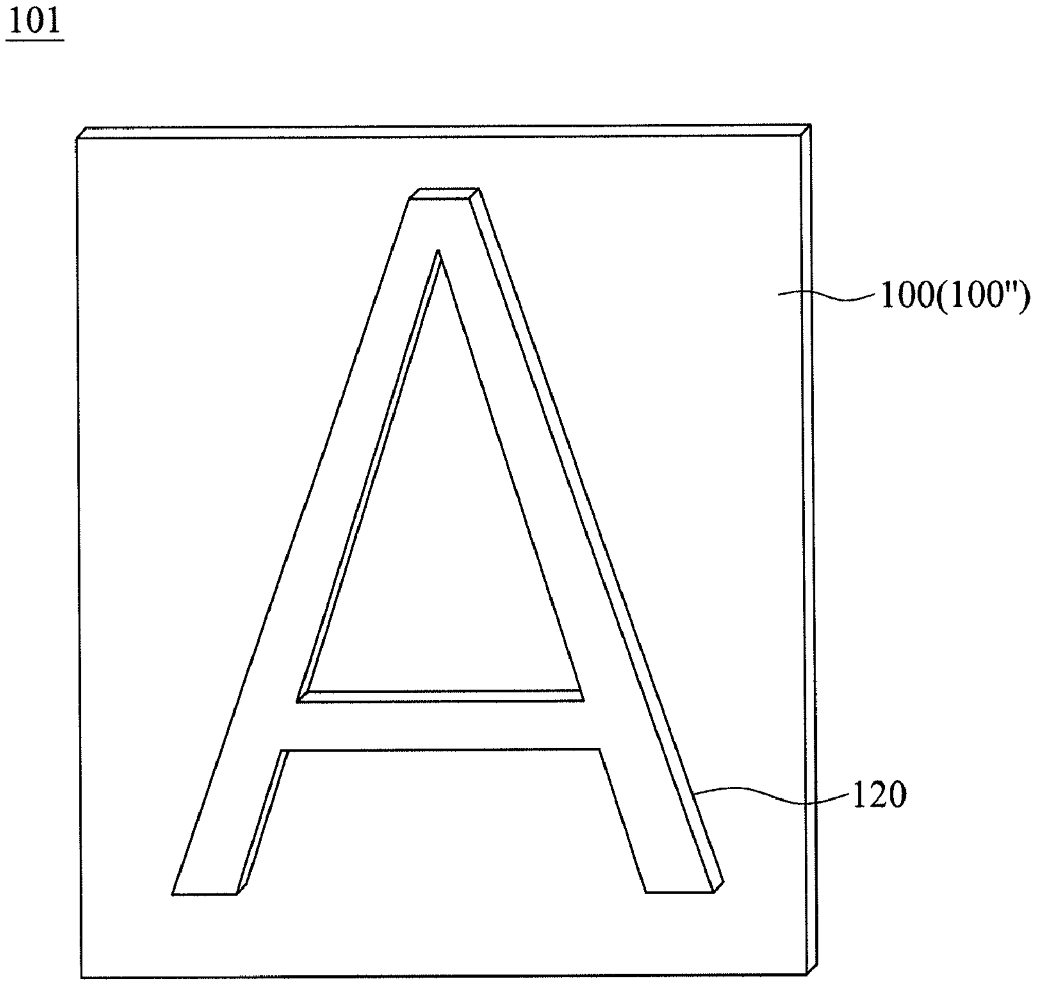
FIG. 6 is a schematic view of another embodiment of the electronic device of the invention.

Moreover, because the electret diaphragms 110A, 110B are disposed on the exterior side of the electro-acoustic transducers 100, 100", a decorative layer 120 is able to be disposed directly on the electro-acoustic transducers 100, 100" to constitute a sound poster 101 (as shown in FIG. 6). The decorative layer 120 may be directly formed on the electret diaphragms 110A, 110B of the electro-acoustic transducers 100, 100" by printing, coating or other method, allowing the sound poster 101 to become a huge speaker.

The electro-acoustic transducers 100, 100" of the electronic device 10 are mainly structured by layering of two electret diaphragms and the plate to form a sound unit. The electro-acoustic transducers 100, 100", occupying small space and comprising flexibility, are best applied in a small-sized electronic device to replace the conventional speaker. In addition, the electret diaphragms of the electro-acoustic transducer are disposed with their electret surfaces (the inner surfaces charged with electric charges) facing inside to cover the plate. Thus, an enclosed space is formed thereby to prevent air particles and mist from entering into the electro-acoustic transducer which affect the electret properties of the electret diaphragms.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device, comprising:
- a main body; and
- an electro-acoustic transducer carried by the main body, comprising:
  - a first electret diaphragm for generating vibration according to a first electrical signal;
  - a second electret diaphragm for generating vibration according to a second electrical signal; and
  - a plate having a plurality of holes formed thereon, and disposed between the first electret diaphragm and the second electret diaphragm.

2. The electronic device as claimed in claim 1, wherein the plate is kept at a distance from the first electret diaphragm and the second electret diaphragm, respectively.

3. The electronic device as claimed in claim 1, wherein each of the first electret diaphragm and the second electret diaphragm comprises:
- a film body, charged with electric charges, having an inner surface and an outer surface; and
- an electrode layer formed on the outer surface;
- wherein the plate is between the inner surface of the first electret diaphragm and the inner surface of the second electret diaphragm.

4. The electronic device as claimed in claim 3, wherein the film body comprises tetrafluoroethylene (PTFE) or tetrafluoroethylene-co-hexafluoropropylene (FEP).

5. The electronic device as claimed in claim 3, wherein the plate further comprises:
- an insulative layer having a first surface and a second surface;
- a first electrode layer, formed on the first surface of the insulative layer, facing the film body of the first electret diaphragm; and
- a second electrode layer, formed on the second surface of the insulative layer, facing the film body of the second electret diaphragm.

6. The electronic device as claimed in claim 5, wherein the second electrode layer and the electrode layer of the first electret diaphragm receive the first electrical signal, and the first electrode layer and the electrode layer of the second electret diaphragm receive the second electrical signal.

7. The electronic device as claimed in claim 5, wherein the first electrode layer receives the second electrical signal, the second electrode layer receives the first electrical signal, and the electrode layer of the first electret diaphragm and the electrode layer of the second electret diaphragm connect to a ground.

8. The electronic device as claimed in claim 5, wherein the plate further comprises:
- at least one first spacer protruding from the first surface of the insulative layer for contacting the first electret diaphragm; and
- at least one second spacer protruding from the second surface of the insulative layer for contacting the second electret diaphragm.

9. The electronic device as claimed in claim 3, wherein the plate is made of conductive material.

10. The electronic device as claimed in claim 9, wherein the plate further comprises:
- at least one first spacer protruding from a first surface of the plate for contacting the film body of the first electret diaphragm;
- at least one second spacer protruding from a second surface of the plate for contacting the film body of the second electret diaphragm.

11. The electronic device as claimed in claim 10, wherein the plate, the first spacer and the second spacer are formed integrally as a single piece by the conductive material.

12. The electronic device as claimed in claim 9, wherein the film body of the first electret diaphragm has positive electric charges carried thereon, and the film body of the second electret diaphragm has negative electric charges carried thereon.

13. The electronic device as claimed in claim 12, wherein the electrode layer of the first electret diaphragm is used for receiving the first electrical signal, the electrode layer of the second diaphragm is used for receiving the second electrical signal, and the plate is used for receiving a third electrical signal.

14. The electronic device as claimed in claim 13, wherein the first electret diaphragm vibrates according to a potential difference between the first electrical signal and the third electrical signal, and the second electret diaphragm vibrates according a potential difference between the second electrical signal and the third electrical signal.

15. The electronic device as claimed in claim 14, wherein the first electrical signal and the second electrical signal are the same, and the phase of the first and the second electrical signals is opposite to that of the third electrical signal.

16. The electronic device as claimed in claim 14, wherein the first electrical signal and the second electrical signal have identical phases.

17. The electronic device as claimed in claim 16, wherein the third electrical signal has a phase, and the phase of the third electrical signal is opposite to the phases of the first and the second electrical signals.

18. The electronic device as claimed in claim 16, wherein the plate is connected to a ground, and the third electrical signal is a ground signal.

19. The electronic device as claimed in claim 1, wherein the electro-acoustic transducer further comprises:

at least one first spacer disposed between the first electret diaphragm and the plate; and at least one second spacer disposed between the second electret diaphragm and the plate.

20. An electro-acoustic transducer, comprising:

a first electret diaphragm for generating vibration according to a first electrical signal;

a second electret diaphragm for generating vibration according to a second electrical signal; and a plate having a plurality of holes formed thereon, and disposed between the first electret diaphragm and the second electret diaphragm.

21. The electro-acoustic transducer as claimed in claim 20, wherein each of the first electret diaphragm and the second electret diaphragm comprises:

a film body, charged with electric charges, having an inner surface and an outer surface; and an electrode layer formed on the outer surface, wherein the plate is between the inner surface of the first electret diaphragm and the inner surface of the second electret diaphragm.

22. The electro-acoustic transducer as claimed in claim 21, wherein the plate further comprises:

an insulative layer having a first surface and a second surface;

a first electrode layer, formed on the first surface of the insulative layer, facing the film body of the first electret diaphragm; and a second electrode layer, formed on the second surface of the insulative layer, facing the film body of the second electret diaphragm;

wherein the second electrode layer and the electrode layer of the first electret diaphragm receive the first electrical signal, and the first electrode layer and the electrode layer of the second electret diaphragm receive the second electrical signal.

23. The electro-acoustic transducer as claimed in claim 22, wherein the plate further comprises:

at least one first spacer protruding from the first surface of the insulative layer for contacting the first electret diaphragm; and at least one second spacer protruding from the second surface of the insulative layer for contacting the second electret diaphragm.

24. The electro-acoustic transducer as claimed in claim 21, wherein the plate is made of conductive material.

25. The electro-acoustic transducer as claimed in claim 24, wherein the plate further comprises:

at least one first spacer protruded from a first surface of the plate for contacting the film body of the first electret diaphragm; and at least one second spacer protruding from a second surface of the plate for contacting the film body of the second electret diaphragm.

26. The electro-acoustic transducer as claimed in claim 24, wherein the film body of the first electret diaphragm has positive electric charges carried thereon, and the film body of the second electret diaphragm has negative electric charges carried thereon.

27. The electro-acoustic transducer as claimed in claim 26, wherein the electrode layer of the first electret diaphragm is used for receiving the first electrical signal, the electrode layer of the second diaphragm is used for receiving the second electrical signal, and the plate is used for receiving a third electrical signal, and wherein the first electret diaphragm vibrates according to a potential difference between the first electrical signal and the third electrical signal, and the second electret diaphragm vibrates according a potential difference between the second electrical signal and the third electrical signal.

28. The electro-acoustic transducer as claimed in claim 27, wherein the first electrical signal and the second electrical signal are the same, and the phase of the first and the second electrical signals is opposite to that of the third electrical signal.

29. The electronic device as claimed in claim 14, wherein the first and second electrical signals are ground signals, and the third electrical signal is a sound signal.

30. The electro-acoustic transducer as claimed in claim 27, wherein the first electrical signal and the second electrical signal have identical phases.

31. The electro-acoustic transducer as claimed in claim 30, wherein the third electrical signal has a phase, and the phase of the third electrical signal is opposite to the phases of the first and the second electrical signals.

32. The electro-acoustic transducer as claimed in claim 30, wherein the plate is connected to a ground, and the third electrical signal is a ground signal.

33. The electro-acoustic transducer as claimed in claim 27, wherein the first and second electrical signals are ground signals, and the third electrical signal is a sound signal.

* * * * *